United States Patent [19]

Harris et al.

[11] Patent Number: 4,643,782

[45] Date of Patent: Feb. 17, 1987

[54] SINGLE CRYSTAL ALLOY TECHNOLOGY

[75] Inventors: Kenneth Harris, Spring Lake; Gary L. Erickson, Muskegon, both of Mich.

[73] Assignee: Cannon Muskegon Corporation, Muskegon, Mich.

[21] Appl. No.: 591,023

[22] Filed: Mar. 19, 1984

[51] Int. Cl.⁴ .............................................. C22C 19/05
[52] U.S. Cl. .................................... 148/404; 148/162; 148/410
[58] Field of Search .................... 148/404, 3, 162, 410; 420/448

[56] References Cited

U.S. PATENT DOCUMENTS 4,371,404 2/1983 Duhl et al. .............................. 148/3

Primary Examiner—R. Dean
Attorney, Agent, or Firm—Price, Heneveld, Huizenga & Cooper

[57] ABSTRACT

Single crystal nickel-base superalloy having very fine gamma prime after heat treatment in a temperature range permitting total gamma prime solutioning without incipient melting. Component of the heat treated alloy has exceptional resistance to creep under high temperature and stress, particularly in that part of the creep curve representing one percent or less elongation. The alloy exhibits exceptionally low steady-state creep rate.

14 Claims, 12 Drawing Figures

SINGLE CRYSTAL ALLOY TECHNOLOGY

BACKGROUND OF THE INVENTION

This invention relates to nickel-base, single crystal superalloys for use in casting components for high stress, high temperature gas turbine applications.

This alloy and alloys of this type are intended for single crystal casting of gas turbine blades, particularly such blades used in maximum performance aircraft turbine engines where high resistance to thermal fatigue, creep and oxidation are essential.

The basic technology of alloys for the casting of single crystal components is described in U.S. Pat. Nos. 3,494,709, 4,116,723 and 4,209,348. An alloy materially improved over those described in these patents is described in my co-pending application for U.S. Patent Ser. No. 339,318, filed Jan. 15, 1982, entitled "Single Crystal (Single Grain) Alloy" U.S. Pat. No. 4,582,548. The alloys of said application are marketed under the trademark "CMSX" as CMSX-2 and CMSX-3 and are hereafter identified as CMSX-2 and CMSX-3. This invention is a creep strength/creep rate improvement on the alloys described in that application. It will be marketed under the "CMSX" trademark as CMSX-4.

Many factors enter into what constitutes an alloy having not only the desired mechanical and environmental performance features but also practical single crystal castability and heat treating characteristics. These two characteristics, i.e., component mechanical-/environmental properties response and commercial producibility, normally conflict with one another in that alloy compositions which result in the desired performance features many times have impractical casting and heat treatment characteristics. Likewise, the reverse is also true.

Among the problems encountered is that of creating an alloy having sufficient creep-rupture and oxidation resistance while also exhibiting a heat treatment temperature range which permits it to be heat treated to a temperature at which all of the primary gamma prime goes into solution without the alloy reaching its incipient melting temperature. In addition, it is desirable that at least some of the eutectic also be solutioned. This range is called the heat treatment "window". Failure to provide a practical "window" such as 25° F. or more makes it all but impossible to heat treat the castings without unacceptable diminishing mechanical properties or scrap rate due to either incomplete solutioning of the primary gamma prime or incipient melting. An alloy which cannot be effectively heat treated to total solutioning of the primary gamma prime without experiencing a significant rejection rate due to incipient melting is little more than a laboratory curiosity and is without practical utility. The alloys CMSX-2 and CMSX-3 described in U.S. patent application Ser. No. 339,318, U.S. Pat. No. 4,582,548, noted above, are alloys which overcome this problem. In a variation of the basic alloy (CMSX-2) described in that application, the coated oxidation/corrosion performance of the alloy was increased with the addition of hafnium (CMSX-3) while retaining a practical solution heat treatment window.

The present invention is the result of research having the objective of retaining the desirable commercial producibility characteristics typical of the CMSX-2 and CMSX-3 alloys while significantly improving the high temperature, high stress, creep resistance of the alloy.

Creep in the form of permanent, plastic deformation of an alloy is normally defined in terms of the percentage of elongation occurring at a given temperature/stress over a specific time period before rupture occurs. While increasing the time and temperature at which creep translates into rupture is important data concerning alloy characteristics, it is not particularly significant to the designer of high performance aircraft turbine engines. The designer is more concerned with the time and temperature range at which a specific percentage of creep will occur. This is important because it determines when and under what conditions a specific dimensional change in the casting will cause malfunction such as results from physical interference between engine components. As the performance characteristics of engine designs increase the clearance between components normally must be decreased, reducing the amount of creep which can be tolerated. At the same time, the increased performance characteristics normally necessitate higher temperatures and speeds, factors which increase stress and accelerate creep. In the modern, high performance, gas turbine engine, designers consider one percent creep the practical limit of acceptability.

The invention provides a nickel-base superalloy which retains the practical heat treatment "window", alloy stability and single crystal castability characteristics of the CMSX-2 and -3 alloys while very significantly improving creep resistance characteristics by increasing both the permissible operating temperature and the time before a one percent creep will occur. This has been done by increasing the refractory element components of the alloy, including the addition of rhenium. The invention achieves a very significant increase in creep resistance without creating alloy instability which can result from the incorporation of rhenium.

Figure 11:
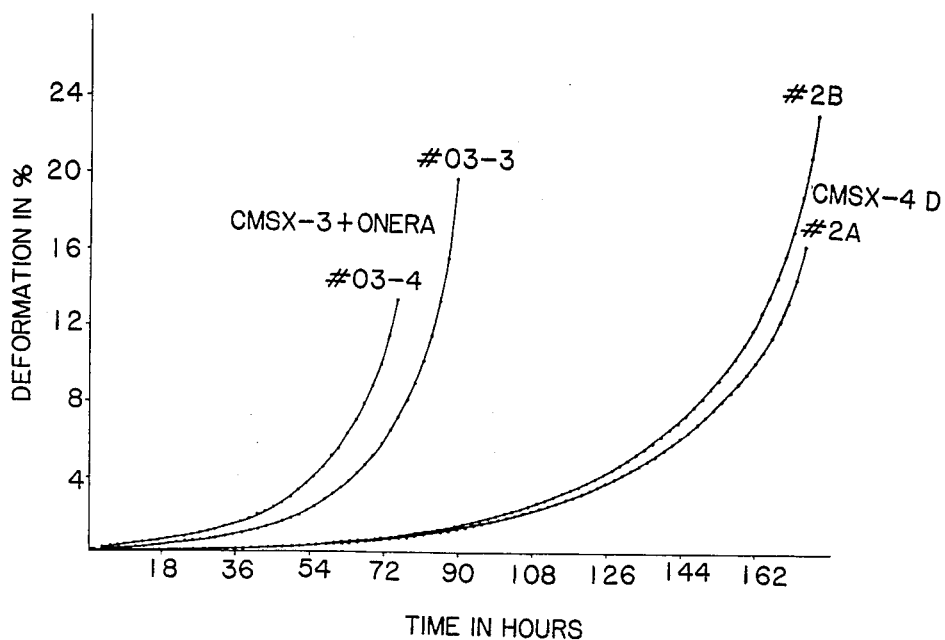
Figure 12:
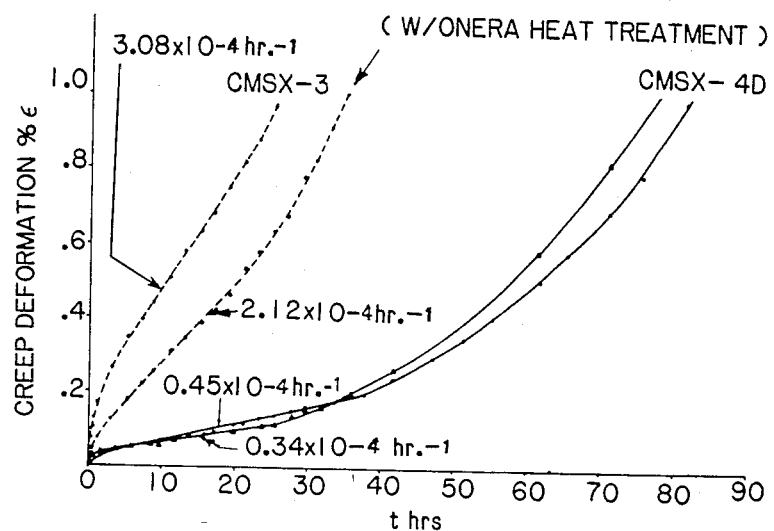

FIG. 11 is a graph comparing the full range of creep characteristics of the CMSX-3 alloys and the alloy of this invention; and FIG. 12 is a graph of the creep characteristics to one percent deformation of the alloy CMSX-3 compared with the creep characteristics of the alloy of this invention.

DESCRIPTION OF THE PREFERRED EMBODIMENT

The basic alloy from which this invention was developed was the hafnium containing, single crystal alloy described in U.S. patent application Ser. No. 339,318, U.S. Pat. No. 4,582,548, hereafter identified as CMSX-3. This alloy has the composition expressed as percentages of weight:

TABLE I

| | |
|---|---|
| Co | 4.3–4.9 |
| Cr | 7.5–8.2 |
| Mo | 0.3–0.7 |
| W | 7.6–8.4 |
| Ta | 5.8–6.2 |
| Al | 5.45–5.75 |
| Ti | 0.8–1.2 |
| Hf | 0.05–0.15 |
| Ni | Balance |
| C | 60 ppm max. |
| Zr | 50 ppm max. |
| B | 30 ppm max. |
| S | 20 ppm max. |
| Si | 400 ppm max. |

Based upon the known alloy technology relating to the use of rhenium as a refractory element and, therefore, expected to increase the strength of an alloy, 3% by weight rhenium was initially substituted for 3% by weight tungsten. Cobalt was substantially increased and chromium was significantly decreased. The result did not produce the desired increase in strength. However, the substantial increase in cobalt did have the desired result of giving good alloy stability.

In a further effort to develop the desired creep resistance without sacrificing corrosion resistance the chromium content was increased from 6.8% to 7.7%. This also was found not to produce the expected or desired improvement.

This alloy, like the first attempt to provide a high creep resistant alloy for use under high stress and temperature while exhibiting no tendency to form mu or sigma phase formations failed to produce the desired increase in strength and, thus, resistance to creep.

In an effort to take a different approach to the creep problem the chromium content was reduced and the refractory elements tungsten and tantalum were both increased as percentages of weight. This results in an alloy having the composition:

TABLE II

| Cr | Co | Mo | W | Ta | Al | Ti | Re | Hf | Ni |
|---|---|---|---|---|---|---|---|---|---|
| 7.2 | 10.0 | .6 | 6.4 | 6.5 | 5.6 | 1.0 | 3.0 | 0.1 | Bal. |

This alloy provided the desired creep strength but at the price of instability when tested at 36 ksi (248 MPa)/1800° F. (982° C.)/194.3 hours in stress rupture tests.

Figure 2:
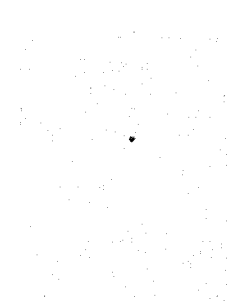
FIG. 2 is a photomicrograph of one of the alloys developed in the creation of this invention taken at 1000× after the specimen has been tested at 36.0 ksi/1800° F./194.3 hours.
Figure 3:
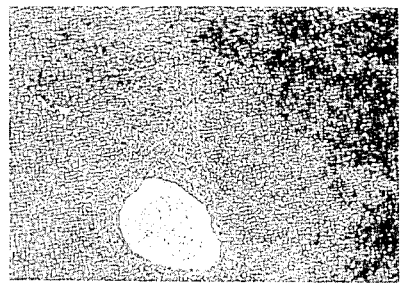
FIG. 3 is a photomicrograph of the alloy of this invention at 1000×.

This alloy under high temperature stress began to evidence the formation of "needles" or acicular characteristics of the chrome-rhenide sigma phase (see FIG. 2). This is evidence of instability, a characteristic of unbalanced rhenium and chromium content. Thus, while rhenium is a known strengthener of alloys of this type it also is prone to creating conditions which materially shorten the useful life of the alloy since the chrome-rhenide acicular formation provides a creep-strength reducing and crack propagating condition.

In an effort to try to avoid the problem of instability and yet develop the desired creep resistance, the composition of the alloy was again changed to increase the nickel content and reduce the chromium and cobalt while retaining the increased level of refractory elements.

The resulting alloy had the preferred composition as percentages of weight:

TABLE III

| Cr | Co | Mo | W | Ta | Al | Ti | Re | Hf | Ni |
|---|---|---|---|---|---|---|---|---|---|
| 6.6 | 9.6 | 0.6 | 6.4 | 6.5 | 5.6 | 1.0 | 3.0 | 0.10 | Bal. | and an operative composition in the range of:

TABLE IV

| Cr | Co | Mo | W | Ta | Al | Ti | Re | Hf | Ni |
|---|---|---|---|---|---|---|---|---|---|
| 6.4 | 9.3 | 0.5 | 6.2 | 6.3 | 5.45 | 0.8 | 2.8 | 0.07 | Bal. |
| 6.8 | 10.0 | 0.7 | 6.6 | 6.7 | 5.75 | 1.2 | 3.2 | 0.12 | Bal. |

At the same time unwanted trace elements were restricted to as little as possible:

| | |
|---|---|
| C | 60 ppm max. |
| B | 30 ppm max. |
| Zr | 75 ppm max. |
| S | 20 ppm max. |
| Si | 400 ppm max. |

The result was a sudden and substantial change in the alloy characteristics. Heat VF552 was prepared having the composition of Table III and single crystal specimens were cast using a high thermal gradient withdrawal process. Stress-rupture test specimens 0.089 inch (2.26 mm)/0.070 inch (1.78 mm) diameter were machined from the longitudinal (001) direction with all being oriented within 10° of the primary axis. Also RT Tensile and Creep Rupture 0.188 inch (4.78 mm) diameter specimens were machined from the longitudinal (001) direction, all being oriented within 10° of the primary axis. The specimen heat treat was 2 hours at 2350° F. (1288° C.)+2 hours at 2360° F. (1293° C.) slow cool+2 hours at 2350° F. (1288° C.)+2 hours at 2360° F. (1293° C.) GFQ by Vac Hyde Processing Corporation. In addition the specimens were Pseudo coated 5 hours at 1800° F. (982° C.) air cooled and then aged 20 hours at 1600° F. (871° C.) then air cooled. The machining and testing was performed by Joliet Metallurgical Laboratories. The results of comparative stress-rupture tests conducted with the alloy of this invention and the alloys CMSX-2 and CMSX-3 are set out in the following table:

TABLE V

| TEST CONDITION | CMSX-4D (VF 552) | | | | CMSX-3 | | CMSX-2 ONERA Treatment Average Life hrs |
|---|---|---|---|---|---|---|---|
| | Specimen Laue$^{a\circ}$ | Life hrs | Elong % 4D | RA % | Average Life hrs | Density Corrected Life hrs | |
| 115 ksi/1400° F. (793 MPa/760° C.) | <3° | 575.8 468.3 | 6.1 13.1 | 12.0 18.2 | 300 | 400 | 800 |
| 75 ksi/1600° F. (517 MPa/871° C.) | 8° | 249.6 232.6 | 15.1 17.8 | 28.7 27.1 | 65 | 80 | 90 |
| 30 ksi/1800° F. (207 MPa/982° C.) | 7¼° | 458.0 507.5 | 23.1 26.4 | 32.5 30.0 | 280 | 350 | 330 |
| 25 ksi/1900° F. (172 MPa/1038° C.) | 7¼° | 110.8 226.2 | 17.8 22.8 | 26.9 31.6 | 100 | 120 | 120 |
| 18 ksi/2000° F. (124 MPa/1093° C.) | 8¼° | 499.9 377.7 | 10.9 15.1 | 19.9 28.4 | 85 | 105 | 130 |

In addition comparative creep rupture tests with CMSX-3 after Onera heat treatment were conducted and the results are set out in the following table:

TABLE VI

| TEST CONDITION | Specm. Laue$^{a\circ}$ | CMSX-4D (VF 552) | | | | | | CMSX-3 ONERA Treatment | | | | | |
|---|---|---|---|---|---|---|---|---|---|---|---|---|---|
| | | Time to 1% Creep hrs | Creep in 20 hrs % | Secondary Creep Rate hr$^{-1}$ | Life hrs | Elong 4D % | RA % | Time to 1% Creep hrs | Creep in 20 hrs % | Secondary Creep Rate hr$^{-1}$ | Life hrs | Elong 4D % | RA % |
| 36 ksi 1800° F. (248 MPa/ 982° C.) | 2° | 82.0 | .110 | $.45 \times 10^{-4}$ | 174.8 | 18.5 | 35.6 | 35.1 | .490 | $2.12 \times 10^{-4}$ | 90.1 | 24.5 | 29.6 |
| | 2° | 77.5 | .097 | $.34 \times 10^{-4}$ | 178.0 | 26.8 | 38.3 | 26.1 | .782 | $3.08 \times 10^{-4}$ | 77.2 | 17.3 | 25.6 |

RT Tensile tests were conducted on the alloy of this invention with the results set out in the following table:

TABLE VII

| RT TENSILE | | CMSX-4D (VF 552) | | |
|---|---|---|---|---|
| Specimen Laue$^{a\circ}$ | 0.2% PS ksi (MPa) | TS ksi (MPa) | Elong % 4D | RA % |
| 2° | 140.8 (971) | 151.6 (1045) | 17.0 | 20.6 |
| 2° | 140.4 (968) | 148.2 (1022) | 20.3 | 20.9 |

Figure 1:
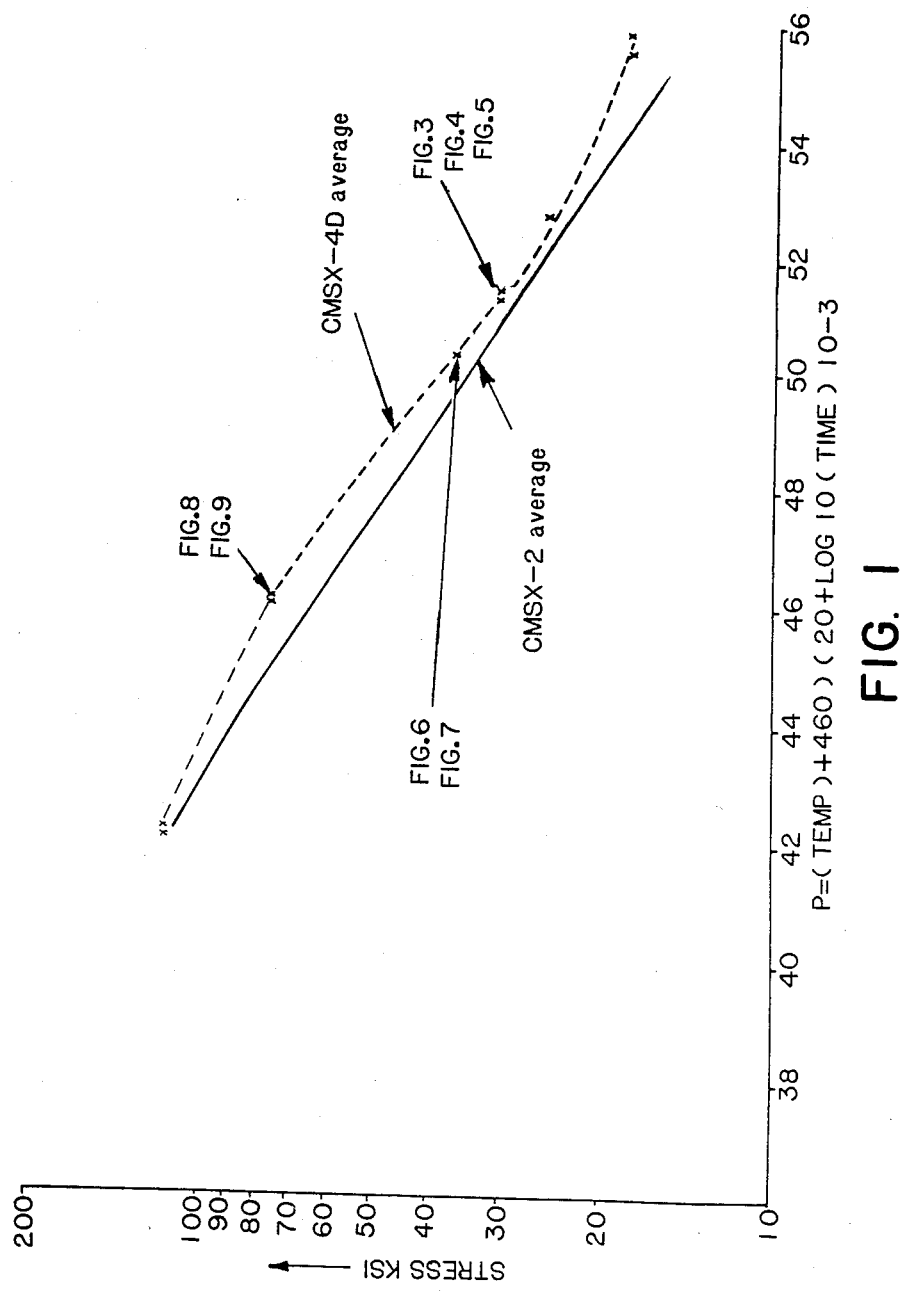
FIG. 1 is a graph of comparative Larson Miller stress-rupture tests on the alloy of this invention and CMSX-2.

Comparative Larson Miller Stress Rupture tests were conducted on MFB 0.070" and 0.089" diameter machined within 10° of (001) on specimens cast as single crystals from the alloy of Table IV (heat VF 552) and of CMSX-2, heats VF267, 312, 438, 466 and 472. The results appear in the graph, FIG. 1. The photomicrographs, FIGS. 3-9, clearly show the uniformity of the microstructure of the alloy and its stability under high temperature and stress.

FIGS. 11 and 12 graphically illustrate the very substantial increase in creep resistance. FIG. 11 illustrates the fact that the time required to rupture at 36.0 ksi at 1800° F. is increased over 100%. This is a very substantial change. FIG. 12, however, is even more significant in that it graphically illustrates the even greater change the invention accomplishes in that portion of the creep curve which is 1% or less which is the range of primary interest to gas turbine design engineers. It will be seen that the initial part of the curve has been substantially flattened. Thus, the period required to produce a 1% creep under the high temperature/stress condition of 36 ksi/1800° F. has been increased from approximately 31 hours to 80 hours, an increase of about 158%. This is a severe test and its significance is that the major portion of the change in creep resistance occurs in the time required to produce the first 1.0% of elongation. Therefore, this change is functionally significant because it occurs in that phase of the alloy's characteristics which determine its functionality and practical utility. The reduction in chromium content has reduced the N$_{v3}$B number of the alloy with the alloy having an N$_{v3}$B number of 2.25 max. The reduction in chromium and anticipated lowering of environmental properties is considered acceptable in view of the major change in creep characteristics.

Figure 4:
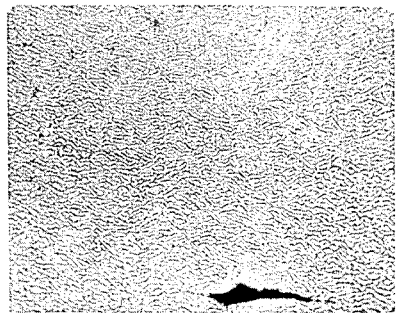
FIG. 4 is a photomicrograph of the alloy of this invention taken at 1000× near fracture after testing at 30 ksi/1800° F./507.5 hours.
Figure 5:
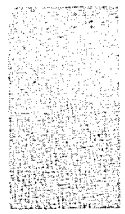
FIG. 5 is a photomicrograph of the alloy of this invention taken in the thread section of the test specimen at 1000×.
Figure 6:
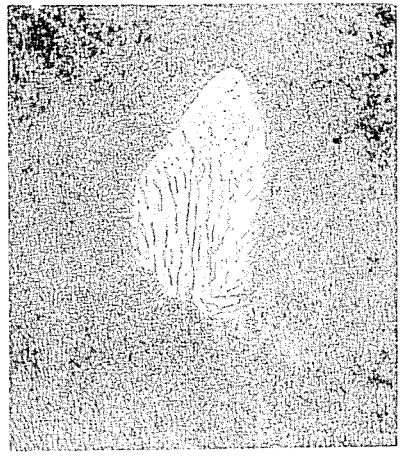
FIG. 6 is a photomicrograph of the alloy of this invention taken at the thread section at 1000× after 36 ksi/1800° F./174.8 hours.
Figure 7:
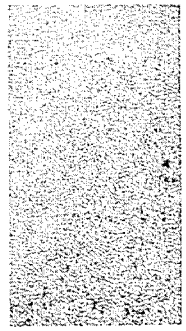
FIG. 7 is a photomicrograph of the alloy of this invention taken near the fracture at 1000× after testing at 36 ksi/1800° F./178.0 hours.
Figure 8:
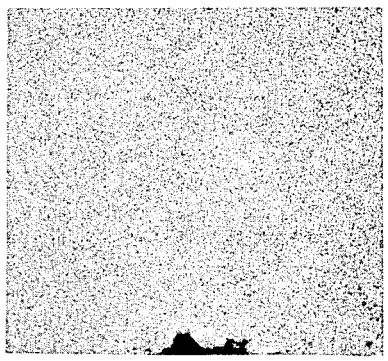
FIG. 8 is a photomicrograph of the alloy of this invention taken near the fracture at 1000× after testing at 75 ksi/1600° F./232.6 hours.
Figure 9:
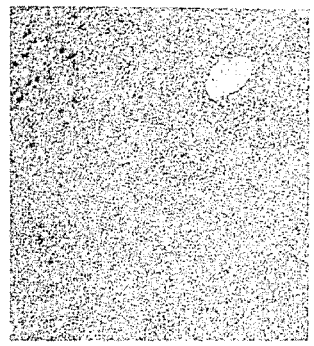
FIG. 9 is a photomicrograph of the alloy of this invention taken at 1000× at the thread section after testing at 75 ksi/1600° F./232.6 hrs.
Figure 10:
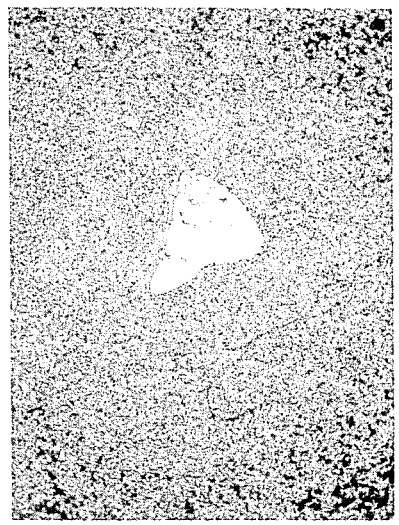
FIG. 10 is a photomicrograph of the alloy of this invention taken at 1000× of the alloy of this invention after heat treatment of 2 hours/2350° F. (1288° C.)+2 hours/2360° F. (1293° C.) slow cool+2 hours/2350° F. (1288° C.)+2 hours/2360° F. (1293° C.) GFQ.

The photomicrographs, FIGS. 4 and 5, clearly show the much finer gamma prime grain structure following stress-rupture testing resulting from the addition of rhenium. The change in the morphology of the gamma prime resulting from the addition of rhenium was discovered when the post-treat microstructure of test pieces made from the alloy were observed. It was also found that rhenium not only restricts initial growth or directional coarsening of the gamma prime phase during stress/temperature exposure, it continues to perform this function in the alloy as the time/temperature/stress load applied to the alloy is increased. It is observed from FIGS. 4 and 7 that even near the fracture and under the same temperature/time/stress conditions as produced the photomicrographs of FIGS. 5 and 6, the "rafting" (directional coarsening) of the gamma prime has progressed only to a small degree in comparison with that which would have been observed under identical conditions had the alloy been heretofore known nickel-based superalloys developed for single crystal casting technology, such as either CMSX-2 or CMSX-3. This has been found to be true despite the fact that rhenium, being a refractory element, while valuable to increase alloy strength, is also known in the art to destabilize alloys when they are subjected to high stress at high temperatures as clearly appears in the formation of acicular chrome-rhenide needles shown in FIG. 2, when a higher chromium content was utilized. The amenability of the alloy of this invention to full solutioning of the ascast gamma prime to produce a fully solutioned microstructure containing 65-68 volume percent of re-precipitated fine, coherent gamma prime with an average size of 0.45 micron or less is believed to be a contributing reason the alloy displays its ability to maximize its creep resistance, especially in the initial stages of creep resulting in the especially important changes in the creep resistance occurring below one percent elongation. It is of further significance that the alloy has accomplished this change in creep resistance without excessive narrowing of the heat treatment window and without introducing microstructural instability. It is also clear from the composition of the alloy as set out in Table IV that it is an alloy of very precise composition with only a very small permissible variation in any one element, if the combined characteristics of creep control, high temperature and stress microstructural stability and a practical heat treat window are to be maintained. Any adverse change in any one of these characteristics, even a minor change, would materially lessen and adversely affect the alloy's characteristics.

The heat treatment window is particularly important because without an adequate temperature spread between the solvus temperature for the gamma prime and the incipient melting point, it is not possible to totally solution the primary gamma prime without incurring a high scrap rate due to incipient melting. A spread of less than 20° F. is impractical, except in the laboratory, because production heat treat equipment cannot be accurately controlled to maintain a temperature within the range, especially in view of the high temperatures and long heat treat periods required. Because of the higher refractory element content of this alloy the heat treat periods should be increased from four to six to eight hours. The fact that this alloy has a solution heat treat temperature spread of 30° F.–40° F. assures complete solutioning of the primary gamma prime without risk of incipient melting. Tests have indicated that it is practical to stay within the 35° F. window using available commercial vacuum solution heat treatment equipment.

While this alloy can be used for any purpose requiring high strength castings incorporating a single crystal, its particular use is in the casting of single crystal blades and vanes for gas turbine engines. While its primary use is in aircraft turbine engines, there are stationary engine applications requiring the specialized high performance characteristics of this alloy. Particularly is this the case in turbine engines, the performance characteristics of which require very restricted clearances thereby materially limiting the amount of permissible creep.

This alloy has particular application in small turbine engines designed to develop high performance characteristics. These engines, to obtain high performance, are normally operated at higher component temperatures than larger engines. Therefore, the problem of creep is increased. The alloy also has application in small engines designed for short term performance at maximum possible temperature and stress to maximize their performance characteristics. In both cases, creep in excess of one percent is considered unacceptable. The creep characteristics of heretofore known state of the art alloys have limited operating temperatures and, thus, maximum performance capability. Tests which have been conducted on the alloy of this invention indicate a 32° F. (17.8° C.) stress-rupture temperature capability advantage at the 35 ksi (241 MPa) stress level compared with the most advanced state-of-the-art high nickel super-alloys such as CMSX-2 and CMSX-3. On the basis of time to one percent creep the temperature capability advantage is 45° F. (25.0° C.). Tests have also indicated capability of high temperature-stressed operation as high as 2000° F. (1093° C.), in short-life very high performance gas turbine engines. The alloy has exhibited excellent oxidation resistance in an oxidizing environment under these maximum operating conditions.

The invention, with a very precise alloy composition, provides an alloy capable of high temperature-stress performance with a significant advantage in creep resistance/creep rate especially in that portion of the range which is practical for engine design.

We claim:

1. A single crystal casting to be used under high stress, high temperature conditions characterized by an increased resistance to creep under such conditions and a heat treat window of approximately 35° F. cast from an alloy consisting essentially of the following elements in the following proportions expressed as percentages of weight:

| | |
|---|---|
| Co | 9.6 |
| Cr | 6.6 |
| Mo | 0.6 |
| W | 6.4 |
| Ta | 6.5 |
| Al | 5.6 |
| Ti | 1.0 |
| Hf | 0.10 |
| Re | 3.0 |
| Ni | Bal |

2. A single crystal casting to be used under high stress, high temperature conditions characterized by an increased resistance to creep under such conditions and a heat treat window of approximately 35° F. cast from an alloy consisting essentially of the following elements in the following proportions expressed as percentages of weight:

| | |
|---|---|
| Co | 9.3–10.0 |
| Cr | 6.4–6.8 |
| Mo | 0.5–0.7 |
| W | 6.2–6.6 |
| Ta | 6.3–6.7 |
| Al | 5.45–5.75 |
| Ti | 0.8–1.2 |
| Hf | 0.07–0.12 |
| Re | 2.8–3.2 |
| Ni | Bal |

3. The single crystal casting claimed in either claims 1 or 2 wherein the alloy from which it was cast is characterized by the capability of complete solutioning of the primary gamma prime without incipient melting.

4. The single crystal casting as claimed in claim 3 further characterized by the capability of the casting to withstanding 36 ksi at 1800° F. for an average 80 hours before sustaining a creep of one percent.

5. A gas turbine blade cast as claimed in either claims 1 or 2.

6. A gas turbine vane cast as claimed in either claims 1 or 2.

7. The casting as claimed in claim 3 wherein the casting is a gas turbine engine blade.

8. The casting as claimed in claim 3 wherein the casting is a gas turbine engine vane.

9. The single crystal casting claimed in claim 3 further characterized by the absence of phase instability after testing under temperature and stress sufficient to rupture the casting.

10. A component for use in a gas turbine engine, cast as a single crystal from an alloy having an incipient melting temperature at least 30° F. above its gamma prime solvus temperature and consisting essentially of the elements Cr 6.4–6.8, Co 9.3–10.0, Mo 0.5–0.7, W 6.2–6.6, Ta 6.3–6.7, Al 5.45–5.75, Ti 0.8–1.2, Hf 0.07–0.12, Re 2.8–3.2, balance Ni, said component after heat treatment at a temperature and for a time period sufficient to solution all its primary gamma prime having the capability of withstanding 36 ksi at 1800° F. (982.2° C.) for 80 hours before sustaining a creep of one percent.

11. A component as claimed in claim 10 wherein the heat treatment included 2 hours at 2350° F. (1288° C.) plus 2 hours at 2360° F. (1293° C.) then slow cooled, then 2 hours at 2350° F. (1288° C.) plus 2 hours at 2360° F. (1293° C.) followed by a gas fan quench.

12. A component as claimed in claim 10 wherein the heat treatment included 4 hours at 2350° F. (1288° C.) plus 4 hours at 2360° F. (1293° C.) followed by a gas fan quench.

13. A component as claimed in claim 12 wherein the component is aged 10 to 30 hours at 1600° F. (871° C.) and then air cooled.

14. A component for use in a gas turbine engine, cast as a single crystal from an alloy having an incipient melting temperature at least 30° F. above its gamma prime solvus temperature and consisting essentially of the elements Cr 6.4–6.8, Co 9.3–10.0, Mo 0.5–0.7, W 6.2–6.6, Ta 6.3–6.7, Al 5.45–5.75, Ti 0.8–1.2, Hf 0.07–0.12, Re 2.8–3.2, balance Ni and being capable of complete primary gamma prime solutioning with alternate heat treatment cycles.

* * * * *